(12) United States Patent
Kim

(10) Patent No.: US 11,456,595 B2
(45) Date of Patent: Sep. 27, 2022

(54) ELECTROSTATIC PROTECTION CIRCUIT AND SEMICONDUCTOR DEVICE INCLUDING THE SAME

(71) Applicant: Samsung Electronics Co., Ltd., Suwon-si (KR)

(72) Inventor: Janghoo Kim, Yongin-si (KR)

( * ) Notice: Subject to any disclaimer, the term of this patent is extended or adjusted under 35 U.S.C. 154(b) by 2 days.

(21) Appl. No.: 17/209,806

(22) Filed: Mar. 23, 2021

(65) Prior Publication Data

US 2022/0102968 A1 Mar. 31, 2022

(30) Foreign Application Priority Data

Sep. 25, 2020 (KR) .......................... 10-2020-0124475

(51) Int. Cl.
| | | |
|---|---|---|
| H02H 9/02 | (2006.01) |
| H01L 27/02 | (2006.01) |
| H02H 9/04 | (2006.01) |
| G06F 3/06 | (2006.01) |

(52) U.S. Cl.
CPC ............... *H02H 9/02* (2013.01); *H01L 27/02* (2013.01); *H01L 27/0266* (2013.01); *H02H 9/04* (2013.01); *G06F 3/06* (2013.01); *H02H 9/046* (2013.01)

(58) Field of Classification Search
CPC .. H02H 9/02; H02H 9/00; H02H 9/04; H02H 9/046; H02H 1/06; H01L 27/02; H01L 27/0266; H01L 21/60; G06F 3/06; G11C 7/10
USPC .......................................... 361/56, 91.1, 111
See application file for complete search history.

(56) References Cited

U.S. PATENT DOCUMENTS

| | | | |
|---|---|---|---|
| 7,280,328 B2 | 10/2007 | Arai et al. | |
| 7,446,378 B2 | 11/2008 | Bakker | |
| 7,532,446 B2 * | 5/2009 | Cheng | .................. H01L 27/0255 |
| | | | 361/111 |
| 8,885,309 B2 | 11/2014 | Kang et al. | |
| 8,964,341 B2 | 2/2015 | Prabhu et al. | |
| 10,020,299 B2 | 7/2018 | Lai | |
| 2003/0057818 A1 | 3/2003 | Ito | |
| 2004/0066227 A1 | 4/2004 | Kupnik et al. | |
| 2008/0144244 A1 | 6/2008 | Van Camp | |
| 2013/0050886 A1 * | 2/2013 | Fan | ......................... H02H 9/044 |
| | | | 361/56 |
| 2015/0092308 A1 * | 4/2015 | P | ..................... H03K 19/018592 |
| | | | 361/86 |
| 2017/0092637 A1 | 3/2017 | Bakalski | |

FOREIGN PATENT DOCUMENTS

| | | |
|---|---|---|
| JP | 2014-146641 A | 8/2014 |
| JP | 2015-159137 A | 9/2015 |
| KR | 2003-0027679 A | 4/2003 |

(Continued)

*Primary Examiner* — Danny Nguyen
(74) *Attorney, Agent, or Firm* — Harness, Dickey & Pierce, P.L.C.

(57) ABSTRACT

An electrostatic protection circuit includes first and second diodes, a resistor and a capacitor, an inverter configured to invert a signal to output an inverted signal to a gate-coupled transistor, a first switch configured to block a first leakage current from flowing through a pull-up driver in response to the inverted signal, and a second switch configured to block a second leakage current from flowing through a pull-down driver in response to the signal.

20 Claims, 7 Drawing Sheets

(56) References Cited

FOREIGN PATENT DOCUMENTS

| KR | 2003-0059483 A | 7/2003 |
| KR | 2004-0008147 A | 1/2004 |
| KR | 2007-0087349 A | 8/2007 |
| KR | 2007-0100026 A | 10/2007 |

* cited by examiner

ELECTROSTATIC PROTECTION CIRCUIT AND SEMICONDUCTOR DEVICE INCLUDING THE SAME

CROSS-REFERENCE TO THE RELATED APPLICATION

This application claims priority from Korean Patent Application No. 10-2020-0124475, filed on Sep. 25, 2020, in the Korean Intellectual Property Office, the disclosure of which is incorporated herein by reference in its entirety.

BACKGROUND

1. Field

Apparatuses and methods consistent with the inventive concepts relate to an electrostatic protection circuit and/or a semiconductor device including the same.

2. Description of the Related Art

A semiconductor device may include an electrostatic protection circuit on input and/or output terminals (e.g., pints, balls, or pads). When a very high voltage is instantaneously applied to the electrostatic protection circuit due to static electricity from the outside, the electrostatic protection circuit performs electrostatic discharge through a discharge path and inhibits (or, alternatively, prevents) an internal circuit of the semiconductor device from being damaged, for example, prevents breakdown or junction spiking of a gate insulation layer of an MOS transistor.

In general, an electrostatic protection circuit includes diodes, and when the size of diodes is increased in order to inhibit (or, alternatively, prevent) the internal circuit from being damaged while increasing a speed of electrostatic discharge, the input and output capacitance of input and/or output terminals may increase and thus an operation speed during a normal operation of the semiconductor device may degrade.

SUMMARY

The example embodiments of the disclosure provide an electrostatic protection circuit and/or a semiconductor device including the same for electrostatic discharge without damage to an internal circuit while appropriately maintaining the size of diodes.

The technical problems solved by the example embodiments are not limited to the above technical problems, and other technical problems which are not described herein will become apparent to those skilled in the art from the following description.

An electrostatic protection circuit in accordance with an example embodiment of the disclosure may include a first diode including an anode electrically connected to a first terminal and a cathode electrically connected to a second terminal; a second diode including an anode electrically connected to a third terminal and a cathode electrically connected to the first terminal; a resistor electrically connected between the second terminal to a first node; a capacitor electrically connected between the first node to the third terminal; an inverter electrically connected between the first node and a second node, the inverter configured to invert a signal of the first node to generate an inverted signal, and to provide the inverted signal to the second node; a gate-coupled transistor electrically connected between the second terminal and the third terminal, the gate-coupled transistor including a gate electrically connected to the second node such that the gate-coupled transistor is configured to respond to the inverted signal of the second node; a first switch configured to block a first leakage current from flowing from the first terminal to the second terminal through a pull-up driver, in response to the inverted signal of the second node; and a second switch configured to block a second leakage current from flowing from the first terminal to the third terminal through a pull-down driver, in response to the signal of the first node.

A semiconductor device in accordance with another example embodiment of the disclosure may include an output driver including a pull-up driver electrically connected between a first terminal and a second terminal and configured to respond to pull-up data, and a pull-down driver electrically connected between the first terminal and a third terminal and configured to respond to pull-down data; and an electrostatic protection circuit including, a first diode including an anode electrically connected to the first terminal and a cathode electrically connected to the second terminal, a second diode including an anode electrically connected to the third terminal and a cathode electrically connected to the first terminal, a resistor electrically connected between the second terminal and a first node, a capacitor electrically connected between the first node and the third terminal, an inverter electrically connected between the first node and a second node, the inverter configured to invert a signal of the first node to generate an inverted signal, and to provide the inverted signal to the second node, a gate-coupled transistor electrically connected between the second terminal and the third terminal, the gate-coupled transistor including a gate electrically connected to the second node such that the gate-coupled transistor is configured to respond to the inverted signal of the second node, a first switch electrically connected between a substrate of the pull-up driver and the second terminal, the first switch configured to block a first leakage current from flowing from the first terminal to the second terminal through the substrate of the pull-up driver, in response to the inverted signal of the second node, and a second switch electrically connected between a substrate of the pull-down driver and the third terminal, the second switch configured to block a second leakage current from flowing from the first terminal to the third terminal through the substrate of the pull-down driver, in response to the signal of the first node.

A semiconductor memory device in accordance with another example embodiment of the disclosure may include a command and address generator, a row decoder, a column decoder, a memory cell array, a data read path unit, a pre-driver and a circuit. The command and address generator is configured to, generate an active command, a read command, and an impedance adjustment command by decoding an inversion chip selection signal and a command signal included in a command/address signal in response to a clock signal, generate a row address based on an address signal included in the command/address signal, in response to the active command, and generate a column address based on the address signal, in response to the read command. The row decoder is configured to generate word line selection signals by decoding the row address. The column decoder is configured to generate column selection signals by decoding the column address. The memory cell array is configured to output data from a plurality of memory cells selected in response to the word line selection signals and the column selection signals. The data read path unit is configured to input the data, and to generate read data. The pre-driver is configured to generate bits of pull-up data or pull-down data, in response to the read data. The circuit is electrically connected between a power voltage terminal and a ground voltage terminal and is configured to, when the read command is generated, generate output data to a data terminal in response to the bits of the pull-up data or the pull-down data, and is configured to, when static electricity is applied, perform an electrostatic discharge operation. The circuit includes a main driver and electrostatic protection circuit. The main driver includes a pull-up driver electrically connected between the data terminal and the power voltage terminal, and a pull-down driver electrically connected between the data terminal and the ground voltage terminal. The electrostatic protection circuit includes, a first diode including an anode electrically connected to the data terminal and a cathode electrically connected to the power voltage terminal, a second diode including an anode electrically connected to the ground voltage terminal and a cathode electrically connected to the data terminal, a resistor electrically connected between the power voltage terminal and a first node, a capacitor electrically connected between the first node and the ground voltage terminal, an inverter electrically connected between the first node and a second node, the inverter configured to invert a signal of the first node to generate an inverted signal, and to provide the inverted signal to the second node, a gate-coupled transistor electrically connected between the power voltage terminal and the ground voltage terminal, the gate-coupled transistor including a gate electrically connected to the second node such that the gate-coupled transistor is configured to respond to the inverted signal of the second node, a first switch electrically connected between a substrate of the pull-up driver and the power voltage terminal, the first switch configured to block a first leakage current from flowing from the data terminal to the power voltage terminal through the substrate of the pull-up driver, in response to the inverted signal of the second node, and a second switch electrically connected between a substrate of the pull-down driver and the ground voltage terminal, the second switch configured to block a second leakage current from flowing from the data terminal to the ground voltage terminal through the substrate of the pull-down driver, in response to the signal of the first node.

DETAILED DESCRIPTION

Hereinafter, an electrostatic protection circuit and a semiconductor device including the same according to various example embodiments of the inventive concepts will be described more fully hereinafter with reference to the accompanying drawings.

Figure 1:
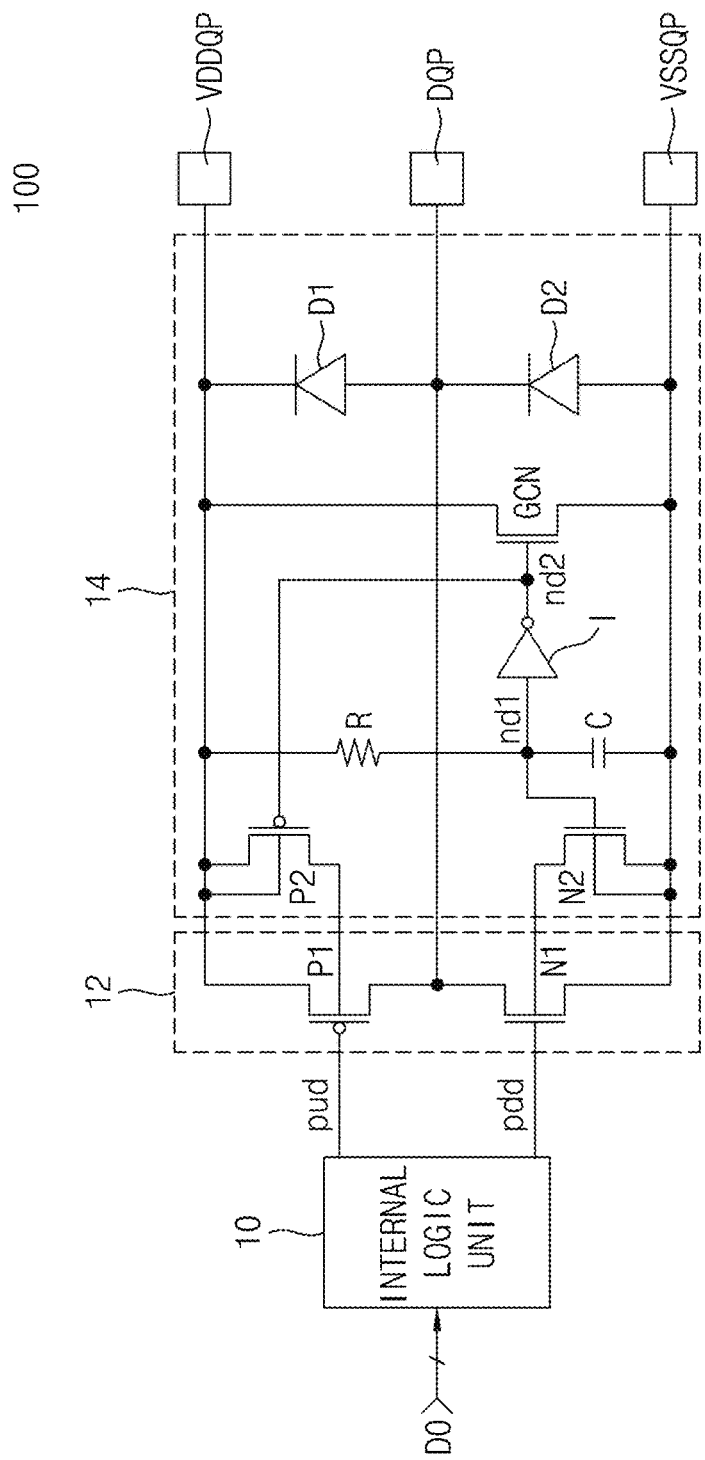
FIG. 1 is a diagram showing the configuration of a semiconductor device including an electrostatic protection circuit according to an example embodiment of the inventive concepts.

FIG. 1 is a diagram showing the configuration of a semiconductor device including an electrostatic protection circuit according to an example embodiment of the inventive concepts.

Referring to FIG. 1, a semiconductor device 100 may include an internal logic unit 10, an output driver 12, an electrostatic protection circuit 14, a power voltage terminal VDDQP, a data terminal DQP, and a ground voltage terminal VSSQP.

In FIG. 1, the internal logic unit 10 may receive output data DO, and may generate pull-up data pud and pull-down data pdd.

The output driver 12 may include a pull-up driver, which is connected between the power voltage terminal VDDQP and the data terminal DQP and generates a signal having a "high" level to the data terminal DQP in response to the pull-up data pud, and a pull-down driver, which is connected between the data terminal DQP and the ground voltage terminal VSSQP and generates a signal having a "low" level to the data terminal DQP in response to the pull-down data pdd. The pull-up driver may be a first PMOS transistor P1, which is a pull-up transistor including a source connected to the power voltage terminal VDDQP, a drain connected to the data terminal DQP, and a gate to which the pull-up data pud is applied, and the pull-down driver may be a first NMOS transistor N1, which is a pull-down transistor including a drain connected to the data terminal DQP, a source connected to the ground voltage terminal VSSQP, and a gate to which the pull-down data pdd is applied.

The electrostatic protection circuit 14 may include a first diode D1 having a cathode connected to the power voltage terminal VDDQP and an anode connected to the data terminal DQP, a second diode D2 having a cathode connected to the data terminal DQP and an anode connected to the ground voltage terminal VSSQP, a resistor R and a capacitor C connected in series between the power voltage terminal VDDQP to the ground voltage terminal VSSQP, an inverter I connected between a first node nd1 between the resistor R and the capacitor C and to a second node nd2, a gate-coupled NMOS transistor GCN including a drain and a source connected to the power voltage terminal VDDQP and the ground voltage terminal VSSQP, respectively, and a gate connected to the second node nd2, a first switch for blocking (or, alternatively, reducing) a first leakage current flowing in the power voltage terminal VDDQP through a substrate of the pull-up driver (e.g., the first PMOS transistor P1) from the data pad DQP in response to a level of the second node nd2 when electrostatic discharge current is applied to the data pad DQP, and a second switch for blocking (or, alternatively, reducing) a second leakage current flowing in the ground voltage terminal VSSQP through a substrate of the pull-down driver (e.g., the first NMOS transistor N1) from the data pad DQP in response to a level of the first node nd1 when electrostatic discharge current is applied to the data pad DQP. For example, the first switch may be a second PMOS transistor P2 having a source and a substrate connected to the power voltage terminal VDDQP, a drain connected to the substrate of the first PMOS transistor P1, and a gate connected to the second node nd2, and the second switch may be a second NMOS transistor N2 having a source and a substrate connected to the ground voltage terminal VSSQP, a drain connected to the substrate of the first NMOS transistor N1, and a gate connected to the first node nd1. The size of each of the first diode D1, the second diode D2, and the gate-coupled NMOS transistor GCN may be larger than the size of each of the first NMOS transistor N1 and the first PMOS transistor P1, and the size of each of the first NMOS transistor N1 and the first PMOS transistor P1 may be larger than the size of each of the second NMOS transistor N2 and the second PMOS transistor P2. In some example embodiments, the first and second leakage currents may be reduced to a negligible level.

A normal operation of the semiconductor device 100 shown in FIG. 1 will be described below.

During the normal operation, a power voltage VDDQ may be applied to the power voltage terminal VDDQP, and a ground voltage VSSQ may be applied to the ground voltage terminal VSSQP. The first diode D1 and the second diode D2 may be reverse-biased, and the capacitor C may be charged with an electric charge through the resistor R. Accordingly, a signal having a "high" level may be generated in the first node nd1, and the second NMOS transistor N2 may be turned on to thereby transmit the ground voltage VSSQ to the substrate of the first NMOS transistor N1. In addition, the inverter I may generate a signal having a "low" level in the second node nd2 by inverting the signal having the "high" level, and the second PMOS transistor P2 may be turned on to thereby transmit the power voltage VDDQ to the substrate of the first PMOS transistor P1. The gate-coupled NMOS transistor GCN may be turned off in response to the signal having the "low" level of the second node nd2. Thus, the electrostatic protection circuit 14 may not be operated.

In this state, the internal logic unit 10 may receive the output data DO having a "high" level, and may generate both the pull-up data pud and the pull-down data pdd having a "low" level. The first PMOS transistor P1 may be turned on in response to the pull-up data pud having a "low" level, and may generate data having a "high" level to the data terminal DQP, and the first NMOS transistor N1 may be turned off. The internal logic unit 10 may receive the output data DO having a "low" level, and may receive the pull-up data pud and the pull-down data pdd having a "high" level. In this case, the first PMOS transistor P1 may be turned off, and the first NMOS transistor N1 may be turned on, and thus data having a "low" level may be generated to the data terminal DQP.

Hereinafter, an electrostatic discharge operation of the semiconductor device 100 shown in FIG. 1 will be described below.

Figure 2:
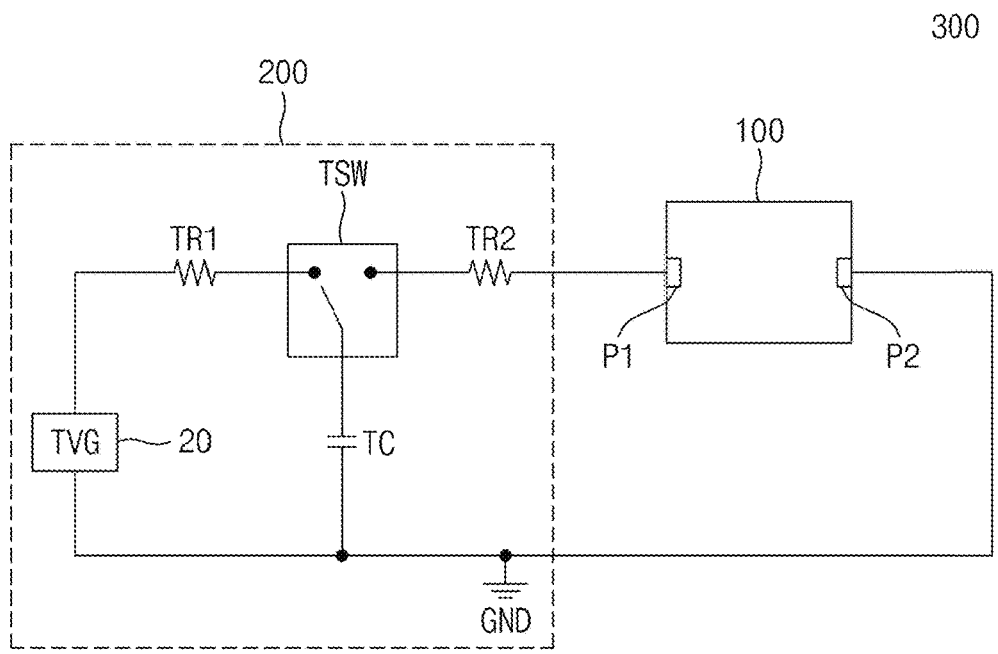
FIG. 2 is a diagram showing an electrostatic discharge test system according to an example embodiment of the inventive concepts.

FIG. 2 is a diagram showing an electrostatic discharge test system according to an example embodiment of the inventive concepts.

Referring to FIG. 2, an electrostatic discharge test system 300 may include an electrostatic discharge tester 200 and the semiconductor device 100. The electrostatic discharge tester 200 may include a test voltage generator (TVG) 20, a switch TSW, resistors TR1 and TR2, and a capacitor TC.

Referring to FIGS. 1 to 2, in an electrostatic discharge test mode, the electrostatic discharge tester 200 may generate a test voltage by the TVG 20 in the state in which the switch TSW is connected to the resistor TR1 and may charge the capacitor TC with an electric charge through the resistor TR1. Then, the electrostatic discharge tester 200 may apply the electric charge charged in the capacitor TC, that is, the positive electrostatic discharge current, to one terminal P1 of the semiconductor device 100 through the resistor TR2 in the state in which the switch TSW is connected to the resistor TR2. The electrostatic discharge tester 200 may generate positive electrostatic discharge current simulating static electricity generated upon contact or friction between a human and the semiconductor device 100.

Figure 3:
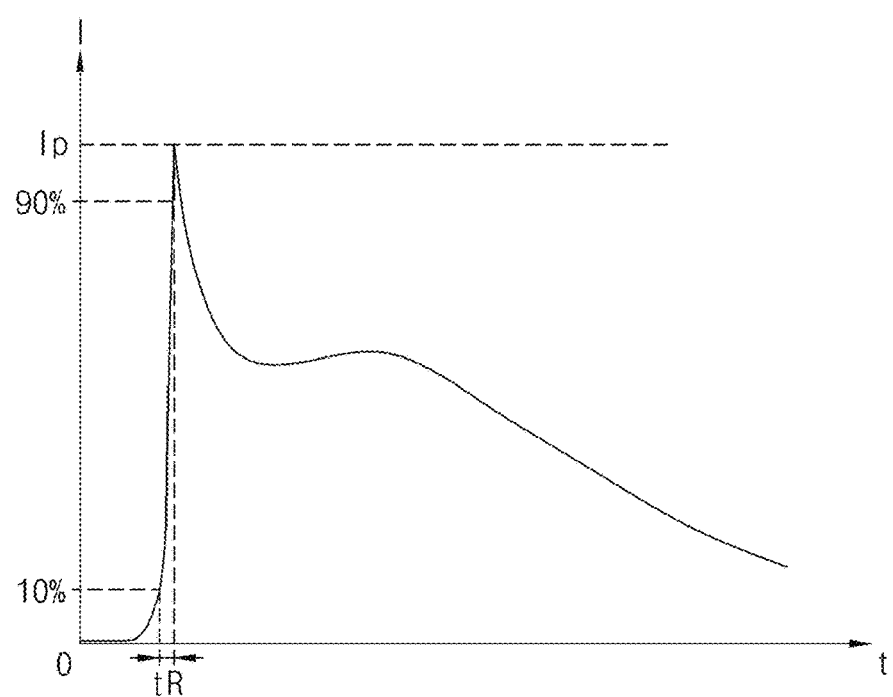
FIG. 3 shows a waveform of a change in current over time of positive electrostatic discharge current applied to the semiconductor device 100 from the electrostatic discharge tester 200 according to an example embodiment of the inventive concepts.

FIG. 3 shows a waveform of a change in current over time of positive electrostatic discharge current applied to the semiconductor device 100 from the electrostatic discharge tester 200 according to an example embodiment of the inventive concepts. When a test voltage is several thousands of V, the peak current Ip of the positive electrostatic discharge current may be several A, and an electrostatic discharge time may be several hundreds of ns. In addition, the positive electrostatic discharge current may be a transient current that rises to the peak current Ip for a short rise time tR, e.g., a rise time of several ns to several tens of ns. The rise time tR may be the time during which electrostatic discharge current rises from 10% to 90%.

Figure 4A:
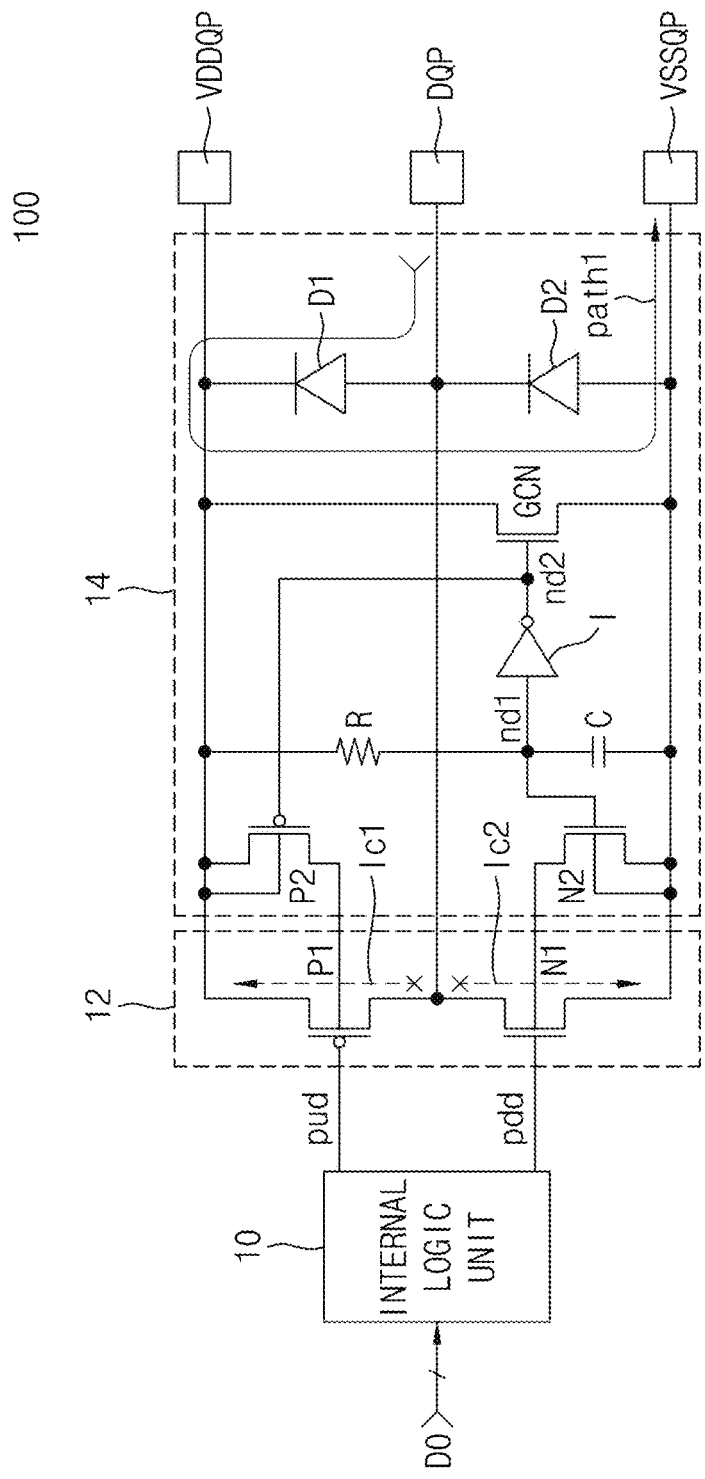
FIG. 4A is a diagram for explaining an electrostatic discharge operation when positive electrostatic discharge current is applied to the data terminal DQP of the semiconductor device 100, the ground voltage terminal VSSQP is connected to a ground GND, and a voltage is not applied to the power voltage terminal VDDQP.

FIG. 4A is a diagram for explaining an electrostatic discharge operation when positive electrostatic discharge current is applied to the data terminal DQP of the semiconductor device 100, the ground voltage terminal VSSQP is connected to a ground GND, and a voltage is not applied to the power voltage terminal VDDQP.

Referring to FIG. 4A, when a voltage difference between the data terminal DQP and the power voltage terminal VDDQP is equal to or greater than a forward voltage, the first diode D1 may be turned on and the second diode D2 may be turned off. Until a voltage of the power voltage terminal VDDQP becomes a predetermined voltage, for example, a power voltage VDD, the capacitor C may be charged with an electric charge through the resistor R, and when the voltage of the power voltage terminal VDDQP is much greater than the predetermined voltage, the capacitor C charged with the electric charge may be discharged. A signal having a "low" level may be generated at the first node nd1, and the second NMOS transistor N2 may be turned off. The inverter I may generate a signal having a "high" level to the second node nd2 by inverting a signal having a "low" level, the second PMOS transistor P2 may be turned off, and the gate-coupled NMOS transistor GCN may be turned on. In this case, the time at which the gate-coupled NMOS transistor GCN is turned on may be set by an RC time constant based on values of the resistor R and the capacitor C. The second PMOS transistor P2 may be turned off to block a first leakage current 1c1 that may flow in the power voltage terminal VDDQP through a substrate of the first PMOS transistor P1 from the data terminal DQP, and the second NMOS transistor N2 may be turned off to block a second leakage current 1c2 that may flow in the ground voltage terminal VSSQP through a substrate of the first NMOS transistor N1 from the data terminal DQP. Accordingly, positive electrostatic discharge current may flow in the ground voltage terminal VSSQP through the first diode D1 and the gate-coupled NMOS transistor GCN. That is, the positive electrostatic discharge current may flow through a normal electrostatic discharge path path1 shown in FIG. 4A.

Figure 4B:
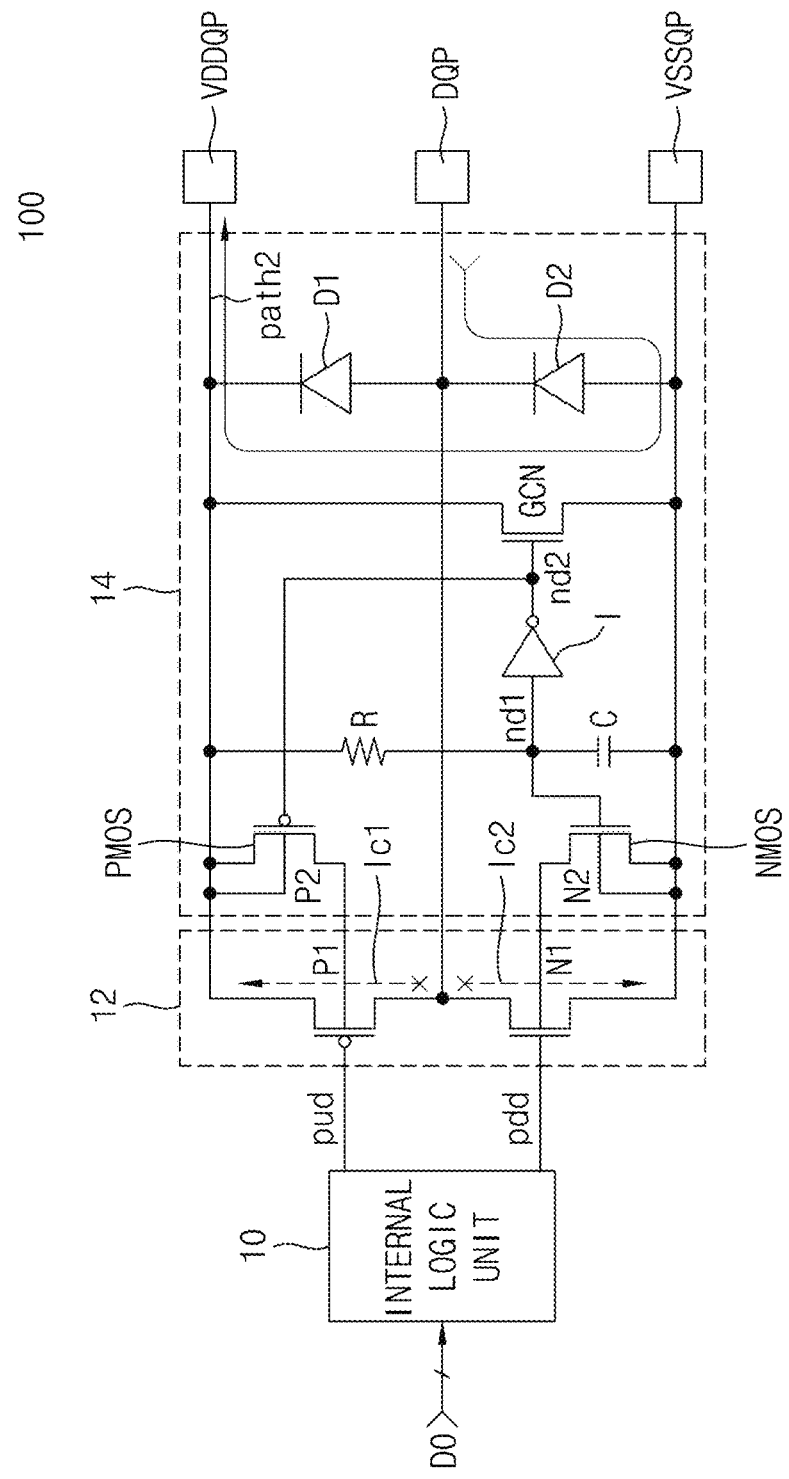
FIG. 4B is a diagram for explaining an electrostatic discharge operation when positive electrostatic discharge current is applied to the data terminal DQP of the semiconductor device 100, the power voltage terminal VDDQP is connected to the ground GND, and a voltage is not applied to the ground voltage terminal VSSQP.

Next, FIG. 4B is a diagram for explaining an electrostatic discharge operation when positive electrostatic discharge current is applied to the data terminal DQP of the semiconductor device 100, the power voltage terminal VDDQP is connected to the ground GND, and a voltage is not applied to the ground voltage terminal VSSQP.

Referring to FIG. 4B, the second diode D2 may be turned on and the first diode D1 may be turned off when a voltage difference between the data terminal DQP and the ground voltage terminal VSSQP is equal to or greater than a reverse voltage. The following operations may be performed in the same way as the description given with reference to FIG. 4A. Thus, the positive electrostatic discharge current may flow in the power voltage terminal VDDQP through the second diode D2 and the gate-coupled NMOS transistor GCN. That is, the positive electrostatic discharge current may flow through a normal electrostatic discharge path path2 shown in FIG. 4B.

Figure 5A:
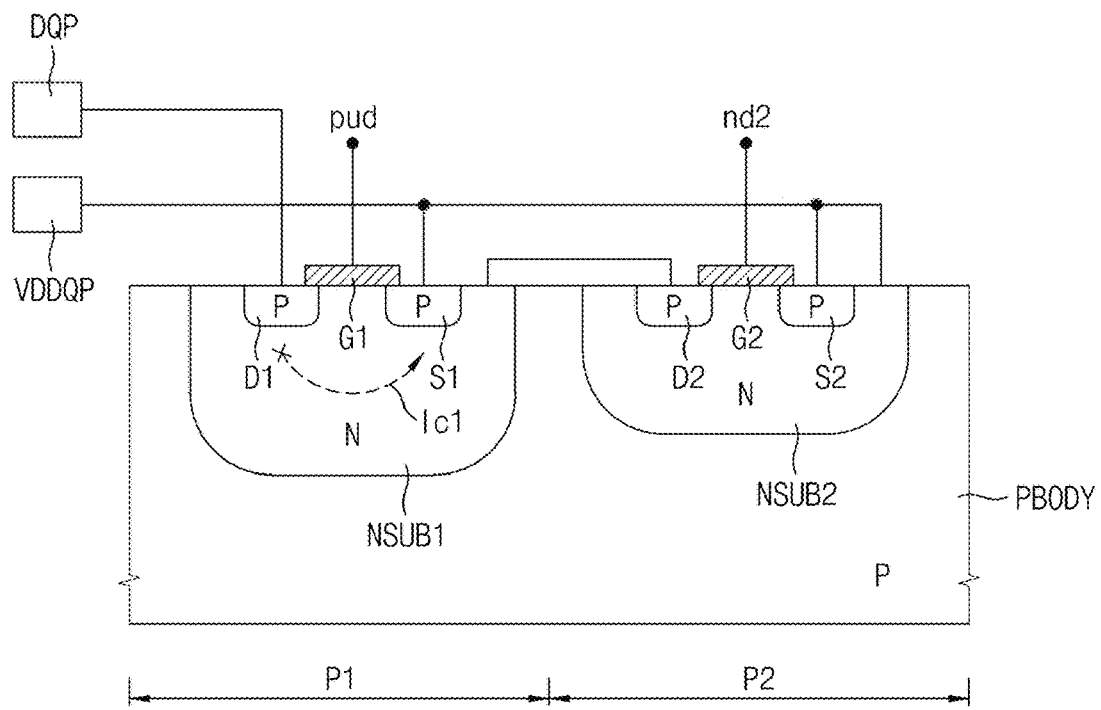
FIG. 5A is a diagram showing the configuration of the first PMOS transistor P1 and the second PMOS transistor P2 according to an example embodiment of the inventive concepts.

FIG. 5A is a diagram showing the configuration of the first PMOS transistor P1 and the second PMOS transistor P2 according to an example embodiment of the inventive concepts.

Referring to FIG. 5A, the first PMOS transistor P1 may include an N-type substrate (or well) NSUB1 formed in a P-type body PBODY, a P-type source S1 and a P-type drain D1 that are formed in the N-type substrate NSUB1, and a gate G1 formed on the N-type substrate NSUB1 between the P-type source S1 and the P-type drain D1, and the second PMOS transistor P2 may include an N-type substrate (or well) NSUB2 formed in the P-type body PBODY, a P-type source S2 and a P-type drain D2 that are formed in the N-type substrate NSUB2, and a gate G2 formed on the N-type substrate NSUB2 between the P-type source S2 and the P-type drain D2. The drain D1 of the first PMOS transistor P1 may be connected to the data terminal DQP, and the source S1 of the first PMOS transistor P1, the source S2 of the second PMOS transistor P2, and the N-type substrate NSUB2 may be connected to the power voltage terminal VDDQP. The size of the second PMOS transistor P2 may be smaller than that of the first PMOS transistor P1.

Referring to FIGS. 4A, 4B, and 5A, when the second PMOS transistor P2 is turned off during an electrostatic discharge operation, the N-type substrate NSUB1 of the first PMOS transistor P1 may not be connected to the power voltage terminal VDDQP. Accordingly, even if a voltage difference between the data terminal DQP and the power voltage terminal VDDQP increases, for example, even if the voltage difference becomes equal to or greater than a forward voltage, a parasitic PN diode (not shown) formed between the drain D1 of the first PMOS transistor P1 and the N-type substrate NSUB1 may not be turned on. Thus, the first leakage current 1c1 may not flow. As a result, the first leakage current 1c1 may be blocked, thereby inhibiting (or, alternatively, preventing) a reduction in a level of electrostatic discharge current, for example, a reduction in a level of the peak current Ip of FIG. 3. However, when the second PMOS transistor P2 is excluded from the electrostatic protection circuit 14 and the N-type substrate NSUB1 of the first PMOS transistor P1 is connected directly to the power voltage terminal VDDQP, a parasitic PN diode (not shown) may be turned on, and thus drain-junction spiking may be caused, thereby damaging the first PMOS transistor P1.

Figure 5B:
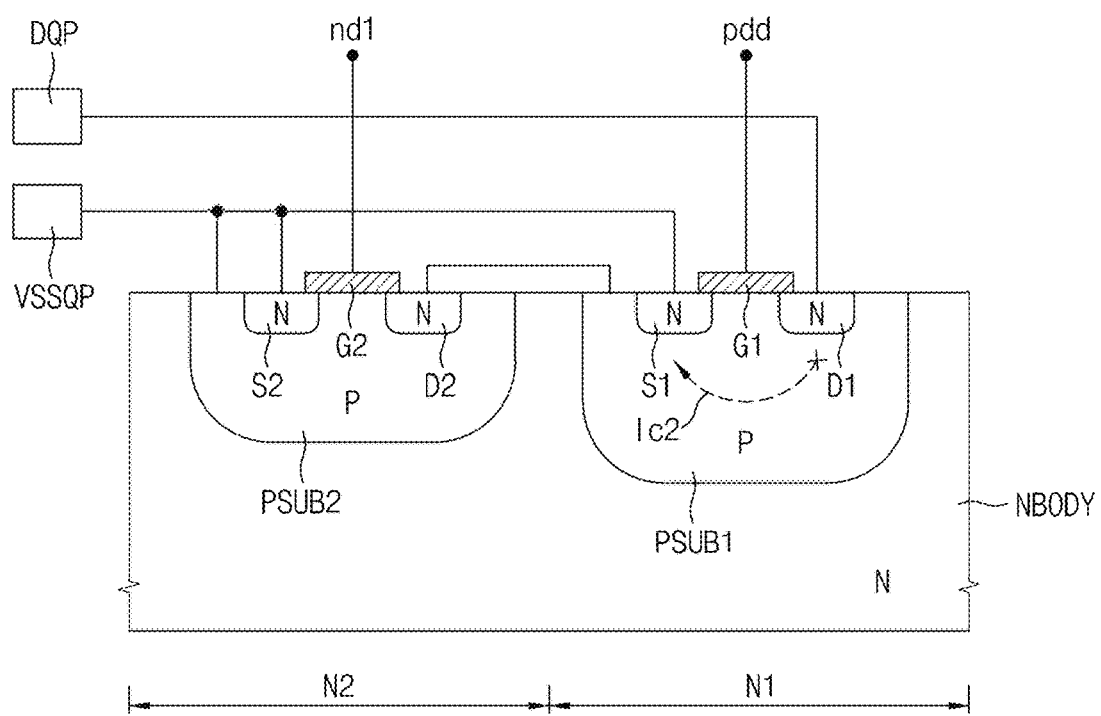
FIG. 5B is a diagram showing the configuration of the first NMOS transistor N1 and the second NMOS transistor N2 according to an example embodiment of the inventive concepts.

FIG. 5B is a diagram showing the configuration of the first NMOS transistor N1 and the second NMOS transistor N2 according to an example embodiment of the inventive concepts.

Referring to FIG. 5B, the first NMOS transistor N1 may include a P-type substrate (or well) PSUB1 formed in an N-type body NBODY, an N-type source S1 and an N-type drain D1 formed in the P-type substrate PSUB1, and the gate G1 formed on the P-type substrate PSUB1 between the N-type source S1 and the N-type drain D1, and the second NMOS transistor N2 may include a P-type substrate (or well) PSUB2 formed in the N-type body NBODY, an N-type source S2 and an N-type drain D2 formed in the P-type substrate PSUB2, and the gate G2 formed on the P-type substrate PSUB2 between the N-type source S2 and the N-type drain D2. The drain D1 of the first NMOS transistor N1 may be connected to the data terminal DQP, and the source S1 of the first NMOS transistor N1 and the source S2 of the second NMOS transistor N2 and the P-type substrate PSUB2 may be connected to the ground voltage terminal VSSQP. The size of the second NMOS transistor N2 may be smaller than that of the first NMOS transistor N1.

Referring to FIGS. 4A, 4B, and 5B, during an electrostatic discharge operation, the second NMOS transistor N2 may be turned off and the P-type substrate PSUB1 of the first NMOS transistor N1 may not be connected to the ground voltage terminal VSSQP. Accordingly, even if a voltage difference between the data terminal DQP and the ground voltage terminal VSSQP greatly increases, for example, even if the voltage difference becomes equal to or greater than a reverse voltage, the parasitic PN diode (not shown) between the drain D1 and the P-type substrate PSUB1 of the first NMOS transistor N1 may be turned off and leakage current may not be generated, and thus the parasitic PN diode (not shown) between the P-type substrate PSUB1 and the source S1 of the first NMOS transistor N1 may also be turned off. Accordingly, a parasitic NPN transistor (not shown) of the first NMOS transistor N1 may not be turned on and the second leakage current 1c2 may not flow. As a result, the second leakage current 1c2 may be blocked, thereby preventing a reduction in a level of electrostatic discharge current, for example, a reduction in a level of the peak current Ip of FIG. 3. However, when the second NMOS transistor N2 is excluded from the electrostatic protection circuit 14 and the P-type substrate PSUB1 of the first NMOS transistor N1 is connected directly to the ground voltage terminal VSSQP, a parasitic NPN transistor (not shown) may be turned on, and thus drain-junction spiking may be caused, thereby damaging the first NMOS transistor N1.

In particular, the aforementioned first leakage current 1c1 and second leakage current 1c2 may be generated when the first PMOS transistor P1 and the first NMOS transistor N1 are formed to have a smaller size than the size of the first diode D1 or the second diode D2, in which case, the second PMOS transistor P2 and the second NMOS transistor N2 may be turned off, thereby blocking the first leakage current 1c1 and the second leakage current 1c2.

Figure 6:
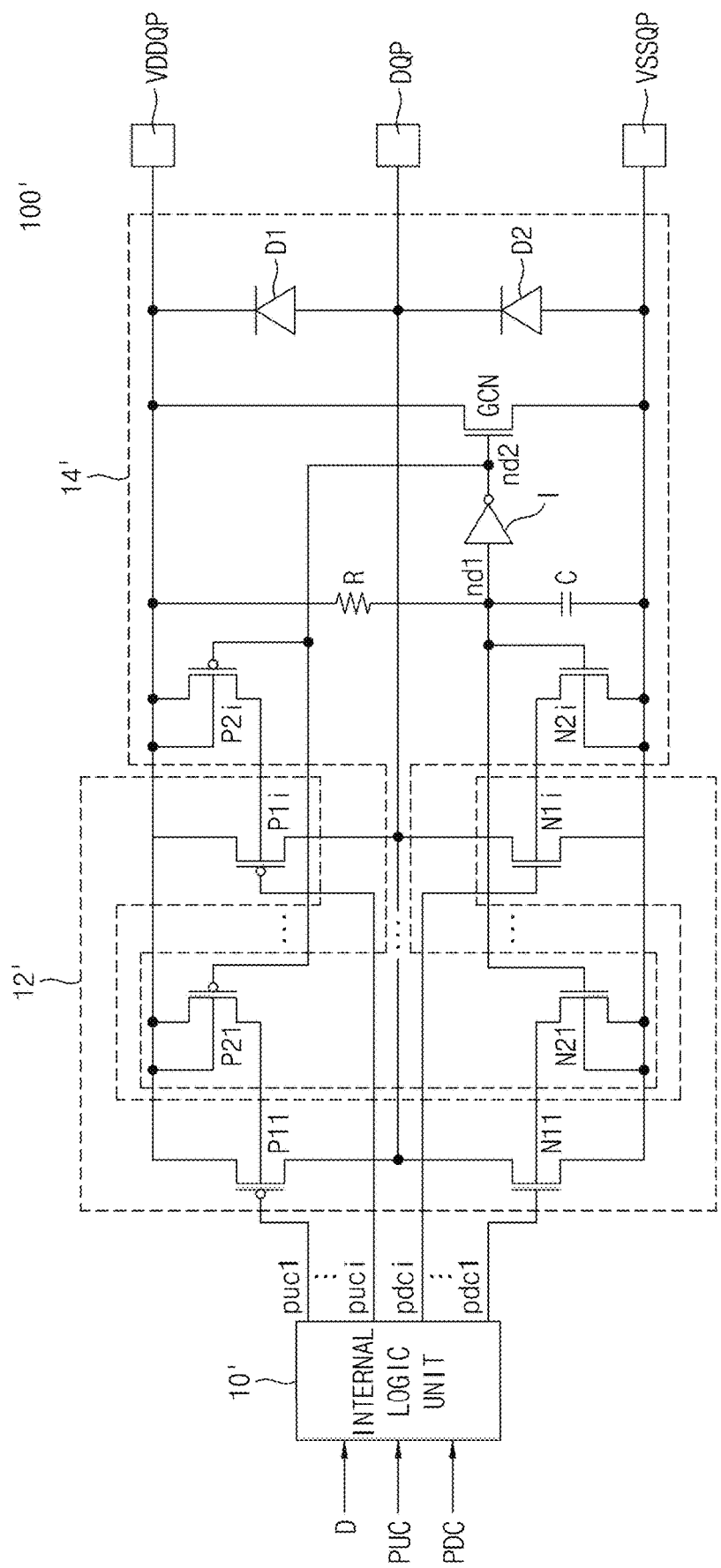
FIG. 6 is a diagram showing the configuration of a semiconductor device including an electrostatic protection circuit according to an example embodiment of the inventive concepts.

FIG. 6 is a diagram showing the configuration of a semiconductor device including an electrostatic protection circuit according to an example embodiment of the inventive concepts.

Referring to FIG. 6, a semiconductor device 100' may include an internal logic unit 10', an output driver 12', an electrostatic protection circuit 14', the power voltage terminal VDDQP, the data terminal DQP, and the ground voltage terminal VSSQP.

The configuration and operation of each block shown in FIG. 6 will be described below.

The internal logic unit 10' may combine the output data DO and a pull-up control code PUC to generate i-bit pull-up data puc1 to puci and may combine the output data DO and a pull-down control code PDC to generate i-bit pull-down data pdc1 to pdci. The pull-up control code PUC may be a code for adjusting pull-up impedance, and the pull-down control code PDC may be a code for adjusting pull-down impedance.

The output driver 12' may include i first PMOS transistors P11 to P1$i$, which are connected in parallel to each other and connect the power voltage terminal VDDQP to the data terminal DQP and have respective gates to which a corresponding bit of the i-bit pull-up data pud1 to pudi is applied, and i first NMOS transistors N11 to N1$i$, which are connected in parallel to each other and connect the data terminal DQP to the ground voltage terminal VSSQP and to which a corresponding bit of the i bits of pull-down data pdc1 to pdci is applied. The i first PMOS transistors P11 to P1$i$ may have different sizes and the i first NMOS transistors N11 to N1$i$ may have different sizes. The i first PMOS transistors P11 to P1$i$ may configure a pull-up driver, and the i first NMOS transistors N11 to N1$i$ may configure a pull-down driver.

The electrostatic protection circuit 14' may include a first switch including i second PMOS transistors P21 to P2$i$ having a source and a substrate connected to the power voltage terminal VDDQP, a drain connected to a substrate of each of the i first PMOS transistors P11 to P1$i$, and a gate connected to the second node nd2, and a second switch including i second NMOS transistors N21 to N2$i$ having a source and a substrate connected to the ground voltage terminal VSSQP, a drain connected to a substrate of each of the i first NMOS transistors N11 to N1$i$, and a gate connected to the first node nd1. The electrostatic protection circuit 14' may have the same configuration as the electrostatic protection circuit 14 shown in FIG. 1 except that the first switch and the second switch.

In the aforementioned example embodiment, the i second PMOS transistors P21 to P2$i$ may be connected to the i first PMOS transistors P11 to P1$i$, respectively, and the i first NMOS transistors N11 to N1$i$ may be connected to the i second NMOS transistors N21 to N2$i$, respectively. However, different from the drawings, at least one second PMOS transistor may be connected to at least one first PMOS transistor having a relatively small size among the i first PMOS transistors P11 to P1$i$, and at least one second NMOS transistor may be connected to at least one first NMOS transistor having a relatively small size among the i first NMOS transistors N11 to N1$i$.

An operation of the output driver 12' and the electrostatic protection circuit 14' of the semiconductor device 100' shown in FIG. 6 could be easily understood with reference to the description of the operation of the output driver 12 and the electrostatic protection circuit 14, which are described above with reference to FIGS. 1 to 5B.

Figure 7:
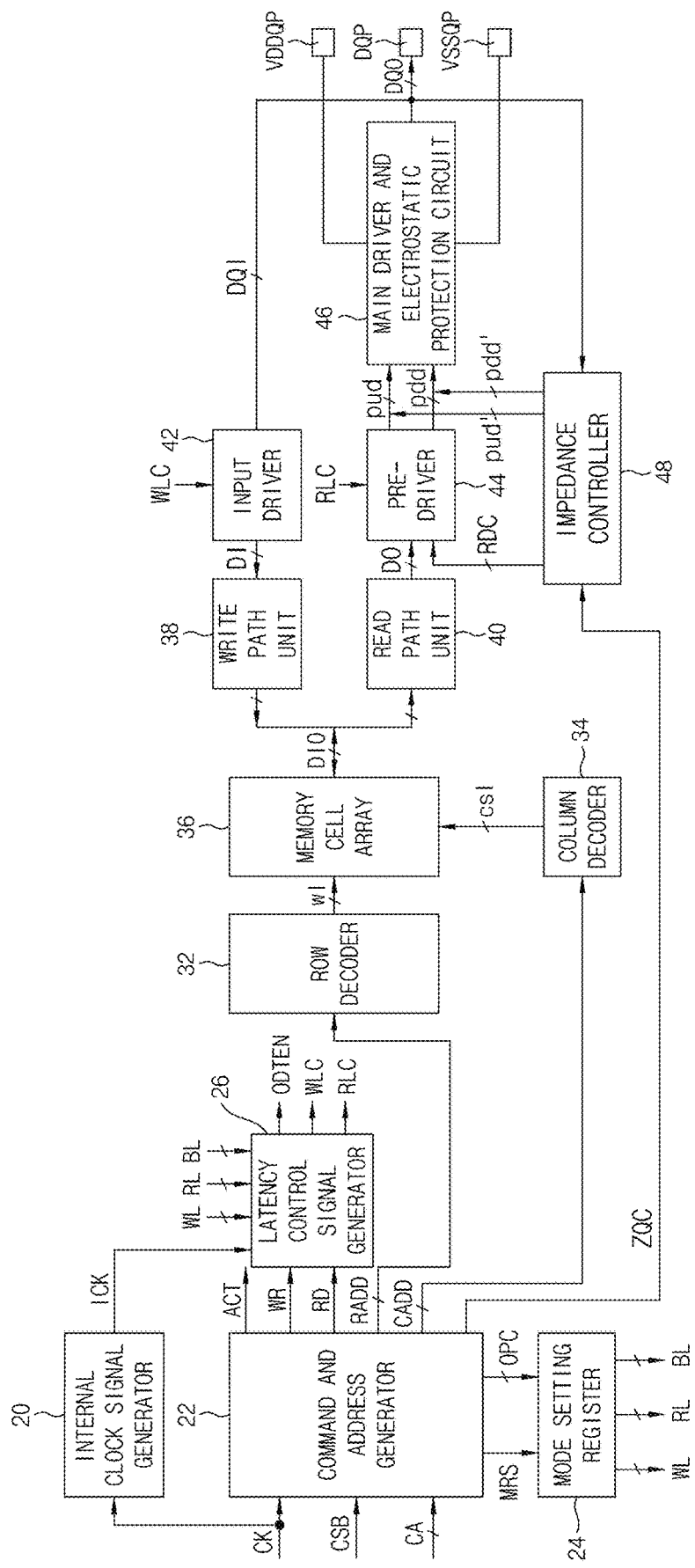
FIG. 7 is a block diagram showing a semiconductor memory device according to an example embodiment of the inventive concepts.

FIG. 7 is a block diagram showing a semiconductor memory device according to an example embodiment of the inventive concepts.

Referring to FIG. 7, a semiconductor memory device may include an internal clock signal generator 20, a command and address generator 22, a mode setting register 24, a latency control signal generator 26, a row decoder 32, a column decoder 34, a memory cell array 36, a write path unit 38, a read path unit 40, an input driver 42, a pre-driver 44, a main driver and electrostatic protection circuit 46, and an impedance controller 48. In addition, the semiconductor memory device 500 may include the power voltage terminal VDDQP to which the power voltage VDDQ is applied, the data terminal DQP to and from which data DQ is input and output, and the ground voltage terminal VSSQP to which the ground voltage VSSQ is applied. In some example embodiments, the semiconductor memory device may further include a row address generator 28 and a column address generator 30.

A function of each of blocks shown in FIG. 7 will be described below.

The internal clock signal generator 20 may receive a clock signal CK and may generate an internal clock signal ICK.

The command and address generator 22 may generate an internal command by inputting an inversion chip selection signal CSB and a command and address CA and decoding command signals included in the inversion chip selection signal CSB and the command and address CA in response to the clock signal CK and may generate address signals included in the command and address CA as a row address RA, a column address CA, or a mode setting code OPC in response to the internal command. The internal command may be an active command ACT, a write command WR, a read command RD, a mode setting command MRS, or an impedance adjustment command ZQC. The command and address generator 22 may generate the row address RADD in response to the active command ACT, may generate a column address CADD in response to the write command WR or the read command RD, and may generate the mode setting code OPC in response to the mode setting command MRS.

The mode setting register 24 may input the mode setting code OPC and may set a write latency WL, a read latency RL, and a burst length BL in response to the mode setting command MRS.

The latency control signal generator 26 may generate a write control signal WLC in response to the write command WR and may generate a read control signal RLC in response to the read command RD. When the write command WR is generated, the latency control signal generator 26 may generate the write control signal WLC that is activated using a value of the internal clock signal ICK and the write latency WL and is deactivated using the internal clock signal ICK and a value of the write latency WL and a value of the burst length BL. That is, the write control signal WLC may be activated while data is input through data terminals DQP. When the read command RD is generated, the latency control signal generator 26 may generate the read control signal RLC that is activated using the internal clock signal ICK and a value of the read latency RL and is deactivated using the internal clock signal ICK and the value of the read latency RL and a value of the burst length BL. That is, the read control signal RLC may be activated while data is output through the data terminals DQP.

The row decoder 32 may generate word line selection signals wl by decoding a row address RADD.

The column decoder 34 may generate column selection signals csl by decoding the column address CADD.

The memory cell array 36 may input and output data DIO to and from a plurality of memory cells selected in response to the word line selection signals wl and the column selection signals csl.

The write path unit 38 may input data DI and may generate the data DIO. The write path unit 38 may sequentially input the data DI by as much as the number corresponding to the value of the burst length BL and may generate the data DIO in parallel.

The read path unit 40 may input the data DIO and may generate data DO. The read path unit 40 may input the data DIO input in parallel and may sequentially generate the data DO by as much as the number corresponding to the value of the burst length BL.

The input driver 42 may be enabled in response to the write control signal WLC to input the input data DQI and to generate the data DI.

The pre-driver 44 may be enabled in response to the read control signal RLC to generate i-bit pull-up control code PUC among 2i-bit driver control code RDC as the i-bit pull-up data pud in response to the data DO having a "high" level and to generate the i-bit pull-down control code PDC among the 2i-bit driver control code RDC as the i-bit pull-down data pdd in response to the data DO having a "low" level.

During a normal read operation, the main driver and electrostatic protection circuit 46 may adjust impedance (driving capability) of a pull-up driver to generate the output data DQO having a "high" level in response to the i-bit pull-up data pud, and may adjust impedance (driving capability) of a pull-down driver to generate the output data DQ0 having a "low" level in response to the i-bit pull-down data pdd. During an impedance adjustment operation, the main driver and electrostatic protection circuit 46 may adjust the impedance (driving capability) of a pull-up driver (not shown) to generate the output data DQO having a "high" level in response to i-bit pull-up code pud' and may adjust the impedance (driving capability) of a pull-down driver (not shown) to generate the output data DQ0 having a "low" level in response to i-bit pull-down code pdd'. The main driver of the main driver and electrostatic protection circuit 46 may have the configuration corresponding to the output driver 12' of FIG. 6, the pull-up driver of the main driver may include the i first PMOS transistors P11 to P1i of FIG. 6, and the pull-down driver may include the i first NMOS transistors N11 to N1i of FIG. 6. The main driver and the electrostatic protection circuit 46 may have the configuration corresponding to the electrostatic protection circuit 14' of FIG. 6. As described above with reference to FIG. 6, the i first PMOS transistors P11 to P1i may have different sizes, the i first NMOS transistors N11 to N1i may have different sizes, a corresponding one of the i second PMOS transistors P21 to P2i may be connected to at least one first PMOS transistor having a small size among the i first PMOS transistors P11 to P1i, and a corresponding one of the second NMOS transistors N21 to N2i may be connected to a first NMOS transistor having a relatively small size among the i first NMOS transistors N11 to N1i.

The impedance controller 48 may be enabled to perform an impedance adjustment operation in response to the impedance adjustment command ZQC. When receiving the impedance adjustment command ZQC, the impedance controller 48 may perform the impedance adjustment operation of receiving respective voltages of the data terminals DQP, comparing the voltage of the data terminal DQP with a reference voltage, e.g., VDDQ/2, and setting a corresponding control code as a driver control code RDC when the voltage of the data terminal DQP and the reference voltage are the same while changing the i-bit pull-up code pud' and the i-bit pull-down code pdd'.

In the aforementioned example embodiments, although the case in which the electrostatic protection circuit is included in each data terminal has been described, the electrostatic protection circuit may be included in all terminals except for data terminals, for example, signal input and/or output terminals such as command/address input terminals.

According to an example embodiment of the inventive concepts, an electrostatic protection circuit and a semiconductor device including the same may stably discharge electrostatic discharge current without damage to an internal circuit while maintaining diodes at appropriate sizes. Accordingly, the reliability of a semiconductor device including the electrostatic protection circuit may be improved.

While some example embodiments of the inventive concepts have been described with reference to the accompanying drawings, it will be understood by those skilled in the art that various modifications may be made without departing from the scope of the inventive concepts and without changing essential features thereof. Therefore, the above-described example embodiments should be considered in a descriptive sense only and not for the purposes of limitation.

What is claimed is:

1. An electrostatic protection circuit comprising:
   a first diode including an anode electrically connected to a first terminal and a cathode electrically connected to a second terminal;
   a second diode including an anode electrically connected to a third terminal and a cathode electrically connected to the first terminal;
   a resistor electrically connected between the second terminal and a first node;
   a capacitor electrically connected between the first node and the third terminal;
   an inverter electrically connected between the first node and a second node, the inverter configured to invert a signal of the first node to generate an inverted signal, and to provide the inverted signal to the second node;
   a gate-coupled transistor electrically connected between the second terminal and the third terminal, the gate-coupled transistor including a gate electrically connected to the second node such that the gate-coupled transistor is configured to respond to the inverted signal of the second node;
   a first switch configured to block a first leakage current from flowing from the first terminal to the second terminal through a pull-up driver, in response to the inverted signal of the second node; and
   a second switch configured to block a second leakage current from flowing from the first terminal to the third terminal through a pull-down driver, in response to the signal of the first node.

2. The electrostatic protection circuit of claim 1, wherein the first terminal is a signal input and/or output terminal, the second terminal is a power voltage terminal, and the third terminal is a ground voltage terminal.

3. The electrostatic protection circuit of claim 1, wherein the gate-coupled transistor is an NMOS transistor.

4. The electrostatic protection circuit of claim 1, wherein the pull-up driver includes a pull-up transistor electrically connected between the second terminal and the first terminal, and
   the first switch is a PMOS transistor including a gate electrically connected to the second node, a drain electrically connected to a substrate of the pull-up transistor, and a source and a substrate electrically connected to the second terminal.

5. The electrostatic protection circuit of claim 4, wherein the pull-down driver includes a pull-down transistor electrically connected between the first terminal and the third terminal, and
the second switch is an NMOS transistor includes a gate electrically connected to the first node, a drain electrically connected to a substrate of the pull-down transistor, and a source and a substrate electrically connected to the third terminal.

6. The electrostatic protection circuit of claim 1, wherein the pull-up driver includes a plurality of pull-up transistors electrically connected in parallel to each other between the second terminal and the first terminal, the plurality of pull-up transistors being different sizes with at least one of the plurality of pull-up transistors being a reduced-size pull-up transistor smaller than other ones of the plurality of pull-up transistors, and
the first switch is at least one PMOS transistor each including a gate electrically connected to the second node, a drain electrically connected to a substrate of the reduced-size pull-up transistor, and a source and a substrate electrically connected to the second terminal.

7. The electrostatic protection circuit of claim 6, wherein the pull-down driver includes a plurality of pull-down transistors electrically connected in parallel to each other between the first terminal and the third terminal, the plurality of pull-down transistors having different sizes with at least one of the plurality of pull-down transistors being a reduced-size pull-down transistor smaller than other ones of the plurality of pull-down transistors, and
the second switch is at least one NMOS transistor including a gate electrically connected to the first node, a drain electrically connected to a substrate of the reduced-size pull-down transistor, and a source and a substrate electrically connected to the third terminal.

8. A semiconductor device, comprising:
an output driver including a pull-up driver electrically connected between a first terminal and a second terminal and configured to respond to pull-up data, and a pull-down driver electrically connected between the first terminal and a third terminal and configured to respond to pull-down data; and
an electrostatic protection circuit including,
a first diode including an anode electrically connected to the first terminal and a cathode electrically connected to the second terminal,
a second diode including an anode electrically connected to the third terminal and a cathode electrically connected to the first terminal,
a resistor electrically connected between the second terminal and a first node,
a capacitor electrically connected between the first node and the third terminal,
an inverter electrically connected between the first node and a second node, the inverter configured to invert a signal of the first node to generate an inverted signal, and to provide the inverted signal to the second node,
a gate-coupled transistor electrically connected between the second terminal and the third terminal, the gate-coupled transistor including a gate electrically connected to the second node such that the gate-coupled transistor is configured to respond to the inverted signal of the second node,
a first switch electrically connected between a substrate of the pull-up driver and the second terminal, the first switch configured to block a first leakage current from flowing from the first terminal to the second terminal through the substrate of the pull-up driver, in response to the inverted signal of the second node, and
a second switch electrically connected between a substrate of the pull-down driver and the third terminal, the second switch configured to block a second leakage current from flowing from the first terminal to the third terminal through the substrate of the pull-down driver, in response to the signal of the first node.

9. The semiconductor device of claim 8, wherein the first terminal is a signal input and/or output terminal, the second terminal is a power voltage terminal, and the third terminal is a ground voltage terminal.

10. The semiconductor device of claim 8, wherein the gate-coupled transistor is an NMOS transistor.

11. The semiconductor device of claim 8, wherein
the pull-up driver includes a pull-up transistor electrically connected between the second terminal and the first terminal, the pull-up transistor including a gate configured to receive the pull-up data such that the pull-up driver is configured to respond to the pull-up data, and
the first switch is a PMOS transistor including a gate electrically connected to the second node, a drain electrically connected to the substrate of the pull-up driver, and a source and a substrate electrically connected to the second terminal.

12. The semiconductor device of claim 11, wherein
the pull-down driver includes a pull-down transistor electrically connected between the first terminal and the third terminal, the pull-down transistor including a gate configured to receive the pull-down data such that the pull-down driver is configured to respond to the pull-down data, and
the second switch is an NMOS transistor including a gate electrically connected to the first node, a drain electrically connected to the substrate of the pull-down driver, and a source and a substrate electrically connected to the third terminal.

13. The semiconductor device of claim 8, wherein
the pull-up driver includes a plurality of pull-up transistors electrically connected in parallel to each other between the second terminal and the first terminal, the plurality of pull-up transistors configured to respond to respective bits of the pull-up data, the plurality of pull-up transistors being different sizes with at least one of the plurality of pull-up transistors being a reduced-size pull-up transistor smaller than other ones of the plurality of pull-up transistors, and
the first switch is at least one PMOS transistor each including a gate electrically connected to the second node, a drain electrically connected to a substrate of the reduced-size pull-up transistor, and a source and a substrate electrically connected to the second terminal.

14. The semiconductor device of claim 13, wherein
the pull-down driver includes a plurality of pull-down transistors electrically connected in parallel to each other between the second terminal and the third terminal, the plurality of pull-up transistors configured to respond to respective bits of the pull-down data, the plurality of pull-down transistors having different sizes with at least one of the plurality of pull-down transistors being a reduced-size pull-down transistor smaller than other ones of the plurality of pull-down transistors, and the second switch is at least one second NMOS transistor including a gate electrically connected to the first node, a drain electrically connected to a substrate of the reduced-size pull-down transistor, and a source and a substrate electrically connected to the third terminal.

15. A semiconductor memory device comprising:

a command and address generator configured to,
  generate an active command, a read command, and an impedance adjustment command by decoding an inversion chip selection signal and a command signal included in a command/address signal in response to a clock signal,
  generate a row address based on an address signal included in the command/address signal, in response to the active command, and
  generate a column address based on the address signal, in response to the read command;
a row decoder configured to generate word line selection signals by decoding the row address;
a column decoder configured to generate column selection signals by decoding the column address;
a memory cell array configured to output data from a plurality of memory cells selected in response to the word line selection signals and the column selection signals;
a data read path unit configured to input the data, and to generate read data;
a pre-driver configured to generate bits of pull-up data or pull-down data, in response to the read data; and
a circuit electrically connected between a power voltage terminal and a ground voltage terminal and configured to, when the read command is generated, generate output data to a data terminal in response to the bits of the pull-up data or the pull-down data, and configured to, when static electricity is applied, perform an electrostatic discharge operation, the circuit including,
  a main driver including a pull-up driver electrically connected between the data terminal and the power voltage terminal, and a pull-down driver electrically connected between the data terminal and the ground voltage terminal; and
  an electrostatic protection circuit including:
    a first diode including an anode electrically connected to the data terminal and a cathode electrically connected to the power voltage terminal,
    a second diode including an anode electrically connected to the ground voltage terminal and a cathode electrically connected to the data terminal,
    a resistor electrically connected between the power voltage terminal and a first node,
    a capacitor electrically connected between the first node and the ground voltage terminal,
    an inverter electrically connected between the first node and a second node, the inverter configured to invert a signal of the first node to generate an inverted signal, and to provide the inverted signal to the second node,
    a gate-coupled transistor electrically connected between the power voltage terminal and the ground voltage terminal, the gate-coupled transistor including a gate electrically connected to the second node such that the gate-coupled transistor is configured to respond to the inverted signal of the second node,
    a first switch electrically connected between a substrate of the pull-up driver and the power voltage terminal, the first switch configured to block a first leakage current from flowing from the data terminal to the power voltage terminal through the substrate of the pull-up driver, in response to the inverted signal of the second node, and
    a second switch electrically connected between a substrate of the pull-down driver and the ground voltage terminal, the second switch configured to block a second leakage current from flowing from the data terminal to the ground voltage terminal through the substrate of the pull-down driver, in response to the signal of the first node.

16. The semiconductor memory device of claim 15, wherein the gate-coupled transistor is an NMOS transistor.

17. The semiconductor memory device of claim 15, wherein
  the pull-up driver includes a plurality of pull-up transistors electrically connected in parallel to each other between the power voltage terminal and the data terminal, the plurality of pull-up transistors configured to respond to respective bits of the pull-up data, and
  the first switch is at least one PMOS transistor each including a gate electrically connected to the second node, a drain electrically connected to a substrate of at least one pull-up transistor among the plurality of pull-up transistors, and a source and a substrate connected to the ground voltage terminal.

18. The semiconductor memory device of claim 17, wherein the plurality of pull-up transistors have different sizes such that the at least one pull-up transistor is a reduced-size pull-up transistor smaller than other ones of the plurality of pull-up transistors.

19. The semiconductor memory device of claim 15, wherein
  the pull-down driver includes a plurality of pull-down transistors electrically connected in parallel to each other between the ground voltage terminal and the data terminal, the plurality of pull-down transistors configured to respond to respective bits of the pull-down data, and
  the second switch is at least one second NMOS transistor including a gate electrically connected to the first node, a drain electrically connected to a substrate of at least one pull-down transistor among the plurality of pull-down transistors, and a source and a substrate connected to the ground voltage terminal.

20. The semiconductor memory device of claim 19, wherein the plurality of pull-down transistors have different sizes such that the at least one pull-down transistor is a reduced-size pull-down transistor smaller than other ones of the plurality of pull-down transistors.

* * * * *